United States Patent [19]
Higgins et al.

[11] Patent Number: 5,347,235
[45] Date of Patent: Sep. 13, 1994

[54] OPTICALLY CONTROLLED OSCILLATOR

[75] Inventors: Thomas P. Higgins; Dana J. Sturzebecher, both of Tinton Falls, N.J.

[73] Assignee: The United States of America as represented by the Secretary of the Army, Washington, D.C.

[21] Appl. No.: 970,191

[22] Filed: Nov. 2, 1992

[51] Int. Cl.$^5$ .................................................. G01J 5/00
[52] U.S. Cl. ................................ 331/66; 331/117 FE; 331/172; 331/177 R; 307/311
[58] Field of Search .......................... 250/551; 257/257; 331/66, 117 FE, 172, 173, 177 R, 108 B, 177 V; 307/311; 328/2

[56] References Cited

U.S. PATENT DOCUMENTS

| | | | |
|---|---|---|---|
| 4,814,774 | 3/1989 | Herczfeld | 342/372 |
| 4,859,965 | 8/1989 | Paolella et al | 330/285 |
| 5,086,281 | 2/1992 | Paolella | 330/279 |
| 5,198,783 | 3/1993 | Jemison et al. | 331/66 |

FOREIGN PATENT DOCUMENTS
0053028  6/1982  Canada .............................. 330/308

Primary Examiner—Robert J. Pascal
Assistant Examiner—Arnold Kinkead
Attorney, Agent, or Firm—Michael Zelenka; William H. Anderson

[57] ABSTRACT

An optically controlled oscillator circuit having an oscillator field effect transistor (FET) and having a separate light sensing quench FET. The optically controlled oscillator circuit includes, a light source, a control connected to the light source, an optic fiber having an end coupled to the light source, a quench field effect transistor (FET) coupled to a second end of the optic fiber, an oscillator FET, each FET being a GaAs multi-finger FET having drains and sources and gates, and a circuit connected in series circuit through the drains and sources of the quench FET and oscillator FET across a source of positive voltage.

7 Claims, 2 Drawing Sheets

OPTICALLY CONTROLLED OSCILLATOR

GOVERNMENTAL INTEREST

The invention described herein may be manufactured, used, and licensed by or for the Government of the United States for governmental purposes without the payment to us of any royalty thereon.

FIELD OF THE INVENTION

The invention relates in general to an optically controlled oscillator, and particularly to an optically controlled MESFET oscillator assembly using a second MESFET unit as an optically sensitive element.

BACKGROUND OF THE INVENTION

The prior art optically controlled oscillator assembly is described in U.S. Pat. No. 4,859,965, issued Aug. 22, 1989. The prior art optically controlled oscillator assembly includes a light source for emitting light at a wavelength in the region of 0.5 micrometers to 1 micrometer, control means coupled to said light source for controlling the intensity of the light emitted from said source, a fixed resistance, a GaAs multi-finger FET having parallel connected sources and parallel connected drains and parallel connected gate fingers, circuit means for connecting the sources and drains of said FET in series circuit with said fixed resistance across a source of positive dc voltage, optic fiber means optically coupled from said light source on the surface of said FET between the sources and drains of the FET and covering substantially all of the gate fingers of the FET, gate biasing means coupled to the gates of said FET for biasing said FET to a point near the pinch-off voltage to maximize the light sensitivity of the FET, a circuit junction of said fixed resistance and said FET, said circuit junction having an output lead, whereby changes in the intensity of light from said light source change the voltage drop across said FET and the voltage applied to said output lead.

One problem with the prior art optical control is that it is sometimes difficult to directly illuminate the surface of the single oscillator FET.

Examples of publications which described these types of devices include the following:

1. Paolella, A., P. R. Herczfeld, A. Madjar, and T. Higgins, "*Optical response of the GaAs MESFET at Microwave Frequencies and Applications*", 1991 MTT-S International Microwave Symposium Digest, pp. 487–490, June 1991, Boston, Mass.

2. de Salles, A. A. A., "*Optical Control of GaAs MESFET's*", IEEE Transactions on Microwave Theory and Techniques, Vol. MTT-31, No. 10, pp. 812–820, October 1983.

3. Sun, H. J., R. J. Gutmann, and J. M. Borrego, "*Photoeffects in common-source and common-drain microwave GaAs MESFET Oscillators,*" Solid State Electronics, Vol. 24, No. 10, pp. 935–940, 1981.

Further U.S. patents and pending U.S. patent applications which describe other types of these devices include the following:

1. "*Optical Control of a Microwave Switch*", U.S. Pat. No. 5,073,718, issued Dec. 17, 1991 to Paolella; and 2. "*Optical Control of a Microwave Switch*" U.S. Pat. No. 5,073,717, issued Dec. 17, 1991 to Paolella et al.

3. "*Optical Control of a Microwave Variable Attenuator*", U.S. Ser. No. 07/788,630, filed Nov. 6, 1991. (Docket 4588.)

SUMMARY OF THE INVENTION

According to the present invention, an optically controlled oscillator assembly or circuit is provided. This assembly comprises, a light source for emitting light at a selective wavelength, control means coupled to said light source for controlling the intensity of the light emitted from said source, a quench FET, an oscillator FET, each said FET preferably having parallel connected sources and parallel connected drains add parallel connected gate fingers, circuit means having a circuit output junction for connecting the sources and drains of said quench FET and said oscillator FET in a series circuit with said circuit output junction across a source of positive dc voltage, optic fiber means optically coupled from said light source to the surface of said quench FET between the sources and drains of the quench FET, and gate biasing means coupled to the gates of said quench FET for biasing said FET to a point near a pinch-off voltage to maximize the light sensitivity of the FET.

By using the quench FET and oscillator FET and connecting circuit means, the problem of directly illuminating the surface of the oscillator FET alone is avoided.

Accordingly, one object of the present invention is to provide an optically controlled oscillator assembly which has a separate optically sensitive element.

BRIEF DESCRIPTION OF THE DRAWINGS

These and other objects, features and details of the invention will become apparent in light of the ensuing detailed disclosure, and particularly in light of the drawings wherein.

DESCRIPTION OF THE PREFERRED EMBODIMENT

Figure 1:
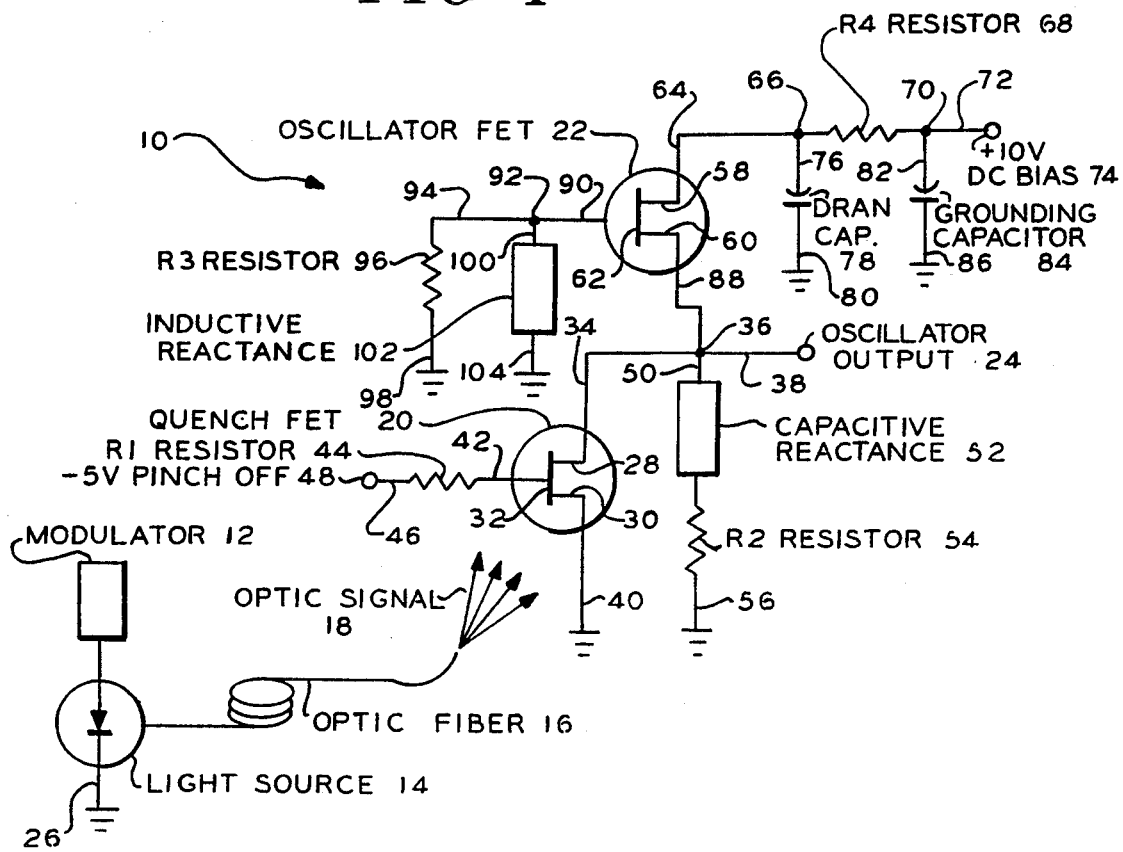
FIG. 1 is a schematic circuit diagram of an optically controlled oscillator assembly according to the present invention.

As shown in FIG. 1, an optically controlled oscillator circuit or assembly or system 10 is provided. Assembly 10 includes a modulator or dc bias modulator 12, a light source or light emitting diode or laser or light emitting diode (LED) 14, an optic fiber or optical fiber 16, which provides an optic signal 18, an optical detector of gallium arsenide (GaAs) MESFET or microwave monolithic integrated circuit (MMIC) field effect transistor (FET) or quench FET 20, .and an oscillator FET 22, which has a construction substantially the same as quench FET 20, and an oscillator output terminal 24.

Light source 14 should emit light at a wavelength in the region of 0.5 micrometers to 1 micrometers because light in this wavelength region is capable of altering the performance of a GaAs FET. As illustrated in FIG. 1, light source 14 may comprise a laser or a LED, such as the pig-tailed LED manufactured by Laser Diode, Inc., No. IRE-160 FA, for example. This LED is capable of producing 300 microwatts power at a wavelength of 840 nanometers. The intensity of the light from the LED 14 may be varied by modulator 12, which acts as the control means for the optical control circuit of the invention.

Light source 14 is connected in series circuit with modulator 12 across a source of positive dc voltage (not shown) by means of a lead or wire 26.

Optic fiber 16 is optically coupled to LED light source 14 and to the quench FET 20. If the aforementioned pig-tailed LED is utilized as the light source, the pig-tail itself is an optic fiber and may be used as the optic fiber 16 in the circuit of the invention.

The quench FET 20, which is similar in construction to the oscillator FET 22, is preferably a GaAs multi-finger FET. The quench FET 20 has parallel connected drains 28, parallel connected sources 30, and parallel connected gates or gate fingers 32. A suitable FET, for example, would be NEC NE 868196 which has 14 gate fingers connected to a single gate bonding pad. The end of the optic fiber 16, which is coupled to quench FET 20, should focus the light from the source 14 on the active surface of the quench FET 20 between the sources and drains of the FET, and the focus light spot should preferably cover substantially all of the gate fingers of the quench FET.

The parallel connected drains 28 and parallel connected sources 30 of the quench FET 20 are connected in a series circuit. The parallel connected drains 28 connect through lead 34 to a circuit junction 36, then through a lead 38 to output 24. The sources 30 connect through a lead 40 to ground.

The parallel connected gates 32 connect through a lead 42 to a gate biasing resistance or R1 resistor 44 and then through lead 46 to a source of −5 V of negative dc pinch-off voltage 48. This pinch-off voltage is of sufficient magnitude to bias the quench FET 20 to a point near the pinch-off voltage of the quench FET 20. Circuit junction 36 also connects through a lead 50 to a capacitive reactance 52, and then connects through an R2 resistor 54, and then through a lead 56 to ground. The pinch-off voltage of a FET is usually defined as the value of the gate voltage that causes the drain current of the FET 20 to be at about 10% of its full value. This is done to maximize the light sensitivity of the FET 20 because it has been found that the maximum change in operating performance of a GaAs FET in response to light directed onto the surface of the FET occurs at a point at or near the pinch-off voltage.

The oscillator FET 22 also has parallel connected drains 58, parallel connected sources 60, and parallel connected gates or gate fingers 62.

The parallel connected drains 58 and parallel connected sources 60 are connected in series. Drains 58 connect, in series, through a lead 64 to a second circuit junction 66, then through an R4 resistor 68 to a third circuit junction 70, then through a lead 72 to a source +10 V dc bias voltage 74. Second circuit junction 66 connects, in series, through a lead 76 to a drain capacitor 78, then through a lead 80 to ground. Third circuit junction 70 connects through a lead 82 to a grounding capacitor 84, then through a lead 86 to ground.

Sources 60, connect through a lead 88 to first junction 36. Gates 62 connect, in series, through a lead 90 to a fourth circuit junction 92, then through a lead 94 to an R3 resistor 96, then through a lead 98 to ground. Fourth circuit junction 92, connects, in series, through a lead 100 to an inductive teacrance 102, then through a lead 104 to ground.

Figure 2:
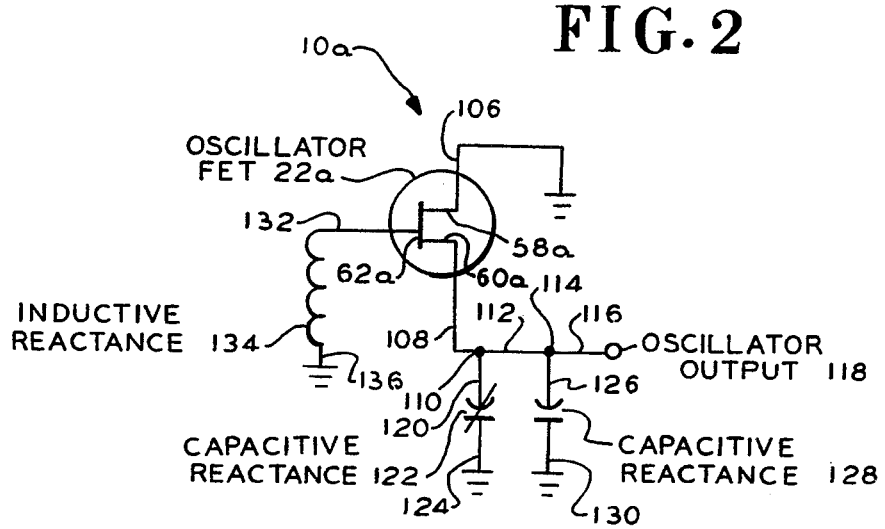
FIG. 2 is schematic representation of the assembly of FIG. 1.

FIG. 2 is an effective AC circuit of FIG. 1 with the quench FET 20 represented by a capacitive teacrance 122. Parts of assembly 10a, which are the same as corresponding parts of assembly 10, have the same numerals but with a subscript "a" added thereto. Assembly 10a has an oscillator FET 22a. FET 22a has drains 58a, sources 60a, and gates 62a. Drains 58 has a lead 106 connected to ground. Sources 60a connect, in series, through a lead 108 to a junction 110, then through a lead 112 to a second junction 114, then through a lead 116 to an oscillator output 118.

First junction 110 connects through a lead 120 to a capacitive teacrance 122 then through a lead 124 to ground. The capacitive teacrance 122 represents quench FET 20 FIG. 1. Second junction 114 connects through a lead 126 to another capacitive teacrance 128, then through a lead 130 to ground. Gates 62a connect through a lead 132 to an inductive reactance 134, then through a lead 136 to ground.

A prototype of assembly 10 was tested. The prototype includes a MMIC unit which has a voltage controlled oscillator 22. In the source circuit of the FET oscillator 22 is MESFET 20 used for the purpose of quenching the oscillator. Quenching is the process of switching on and off the oscillations, without changing the bias conditions on the oscillating device. Switching a teacrance in or out of the circuit, by applying a voltage to the gate 32 of the quenching FET 20, allows control of the negative resistance required for oscillation. The quenching FET 20 is kept pinched off for the oscillator 22 to operate.

With the quenching FET 20 pinched off by the application of −5 volts, the oscillator 22 operates normally. The FET oscillator 22 is in the common drain configuration with series feedback. Resistors 54, 96 and 68 serve as biasing elements. The output oscillator frequency is determined by the teacrance of 102 and 52 where 102 is inductive and 52 is capacitive, also shown by 134 and 128.

FIG. 2 shows the effective AC circuit of FIG. 1. Output oscillator frequency is calculated by the formula:

$$W = \frac{1}{L_G C_{gd}} \left[ 1 + \frac{C_{gs}(C_{ds} + C_L)}{(C_{gs} + C_{ds} + C_L)C_{gd}} \right]^{-1}$$

Where $L_G$ is the inductance on the gate of 22a. $C_{gd}$ is the gate to drain capacitance of 22a. $C_{gs}$ is the gate to source capacitance, $C_{ds}$ is the drain to source capacitance and $C_L$ is the capacitance of the load, equivalent to the parallel combination of capacitive reactances 122 and 128. The quenching FET 20 when biased to a pinch-off voltage, effectively becomes the capacitive teacrance 122, and is made variable by optical illumination 18 from the optical fiber 16.

Figure 3:
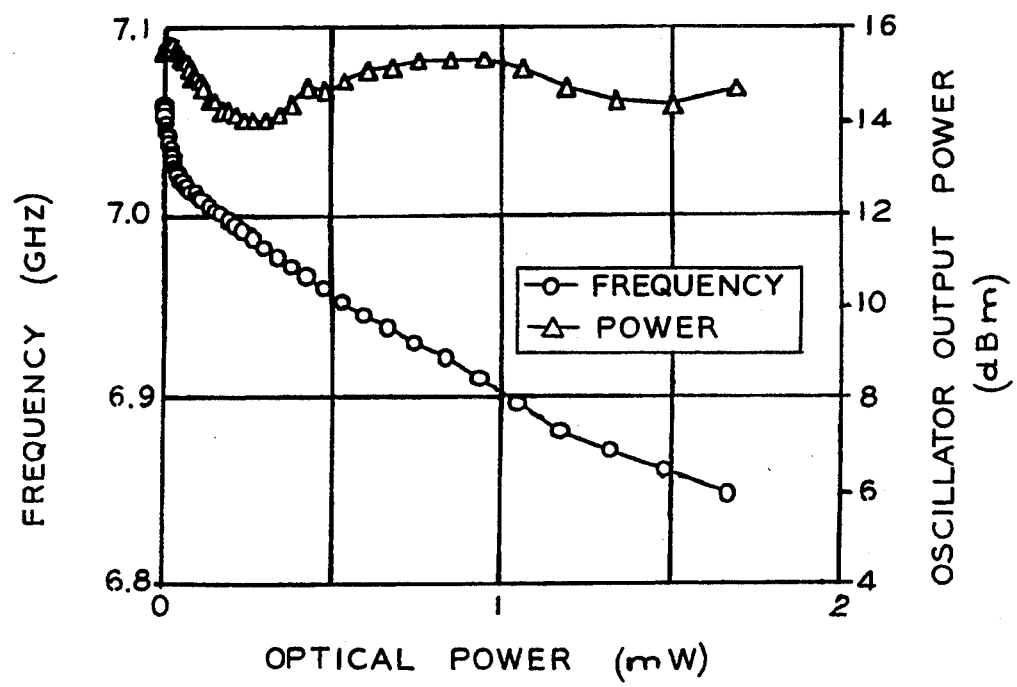
FIG. 3 is a first curve of frequency versus optical power and a second curve of oscillator output power versus optical power.

FIG. 3 shows that optical power incident on MESFET 20 increases the device capacitance and lowers the operating frequency. The equation above, when using approximate numbers from a circuit model, shows that a change upward of 0.02 pf in $C_L$ lowers the oscillating frequency about 190 MHz, which is consistent with measured data in FIG. 3. The MMIC oscillator 22 was also frequency modulated. The laser 14 was intensity modulated at a rate of 200 MHz to nearly 100% modulation depth.

Figure 4:
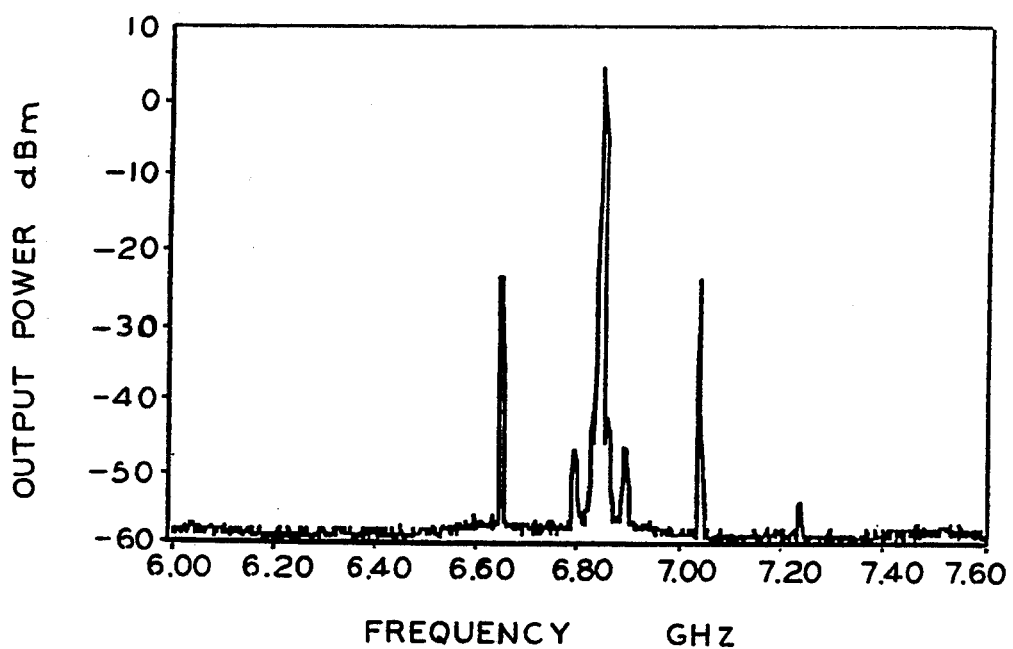
FIG. 4 is a curve of output power versus frequency.

FIG. 4, taken from a connected spectrum analyzer (not shown) shows the narrowband FM spectrum with minimal incidental AM.

The optical output of the 840 nm laser 14 was coupled into the 50 um optical fiber 16, which was positioned directly above the MESFET 20 to be illuminated. A micropositioner was used to maneuver the fiber 16 for maximum response, which found the best position to be actually contacting the device. An advantage of direct contact of the fiber 16 with the MMIC 20 is that noise and frequency jitter, caused by slight vibration of the fiber 16 in air, is reduced. The MESFETs 20, 22 on these chips have an approximately 8-9 um drain to source spacing, which allows approximately 13% of the optical power to penetrate thru to the active area.

The advantages of assembly 10 are indicated hereafter.

A) The assembly 10 permits placement of the microwave component 22 and the optical component 20 on a single monolithic chip.

B) The quench FET 20 avoids the problem of directly illuminating the oscillator FET 22.

C) Assembly 10 permits direct contact of the fiber 16 with the quench FET 20, whereby noise and frequency jitter of fiber 16 is minimized.

While the invention has been described in its preferred embodiment, it is to be understood that the words which have been used are words of description rather than limitation and that changes may be made within the purview of the appended claims without departing from the true scope and spirit of the invention in its broader aspects.

For example, an optically tuned oscillator circuit can be optimized for a larger tuning range using conventional CAD techniques, to exploit the particular optical effect of the MESFET described here.

As another example, the oscillator FET 22, and quench FET 20, can be a single-finger type of FET instead of a multi-finger type of FET.

What is claimed is:

1. An optically controlled oscillator circuit comprising:
    a light source for emitting light at a selective wavelength;
    control means coupled to said light source for controlling the intensity of the light emitted from said light source;
    a quench field effect transistor (FET) and a separate oscillator field effect transistor (FET);
    each said FET having at least one source, at least one drain and at least one gate;
    circuit means having a circuit output junction, the circuit means connecting the respective source and drain of said quench FET and said oscillator FET in a series circuit with said circuit output junction across a source of positive dc voltage;
    means optically coupled from said light source to a surface of said quench FET between the source and drain of the quench FET and covering substantially all of the gate of the quench FET; and
    gate biasing means coupled to the gate of said quench FET for biasing said quench FET to a point near a pinch-off voltage to maximize the light sensitivity of the quench FET.

2. The optically controlled oscillator circuit of claim 1, wherein said quench FET and said oscillator FET are portions of a single gallium arsenide (GaAs) microwave lithic integrated circuit (MMIC) monolithic chip.

3. The optically controlled oscillator circuit of claim 1, wherein said oscillator FET gate connects through an inductive reactance to ground and said circuit output junction connects through a capacitive teacrance to ground.

4. The optically controlled oscillator circuit of claim 1, wherein said means optically coupled from said light source to said quench FET is an optical fiber.

5. The optically controlled oscillator circuit of claim 1, wherein said light source is a laser.

6. An optically controlled oscillator circuit comprising;
    a light source for emitting light at a selective wavelength;
    control means coupled to said light source for controlling the intensity of light from said light source;
    a quench FET;
    an oscillator field effect transistor (FET) having a drain and a source and a gate;
    circuit means having a circuit output junction;
    said circuit means connecting the source and drain of said oscillator FET in series circuit with said a quench FET and with said circuit output junction across a source of positive voltage; and
    means optically coupled from said light source on a surface of said quench FET.

7. An optically controlled oscillator circuit comprising;
    a light source;
    a control connected to the light source;
    an optic fiber having a first end coupled to the light source;
    a quench field effect transistor (FET) coupled to a second end by the optic fiber;
    an oscillator FET separate from the quench FET:
    each said FET being a gallium arsenide (GaAs) FET having at least one drain, at least one source, and at least one gate;
    a negative voltage source connected to the gate(s) of the quench FET;
    a positive voltage source;
    circuit means having a circuit output junction; and
    said circuit means connected to the positive voltage source and connected in series circuit through the oscillator FET drain then connected through the oscillator FET source to the circuit output junction then connected through the quench FET drain then connected through the quench FET source to ground.

* * * * *